United States Patent
Meert et al.

(10) Patent No.: US 6,720,774 B2
(45) Date of Patent: Apr. 13, 2004

(54) INTERCHANGEABLE FAN CONTROL BOARD WITH FAULT DETECTION

(75) Inventors: Carl L. Meert, Sunnyvale, CA (US); Thomas E. Stewart, Saratoga, CA (US); Timothy W. Olesiewicz, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 77 days.

(21) Appl. No.: 10/208,162

(22) Filed: Jul. 29, 2002

(65) Prior Publication Data

US 2004/0017204 A1 Jan. 29, 2004

(51) Int. Cl.[7] .............................................. G01R 31/08
(52) U.S. Cl. ....................... 324/512; 324/500; 324/537; 361/695
(58) Field of Search ................................ 324/511, 512, 324/500, 510, 537, 538; 318/268, 434, 471; 361/695

(56) References Cited

U.S. PATENT DOCUMENTS 5,909,584 A * 6/1999 Tavallaei et al. ............ 713/300
6,188,235 B1 * 2/2001 Buks et al. .................. 324/768
6,380,704 B1 * 4/2002 Chin ........................... 318/268
6,549,406 B1 * 4/2003 Olesiewicz et al. .......... 361/695

* cited by examiner

Primary Examiner—Charles H. Nolan, Jr.
Assistant Examiner—Minh Chau
(74) Attorney, Agent, or Firm—O'Melveny & Myers LLP

(57) ABSTRACT

A control board controls operation of a plurality of ventilation fans and generates a fault signal upon occurrence of a predetermined fault condition. The control board includes a control circuit in a circuit board, an interface connector connected to the control circuit and mounted to the circuit board, and control connectors connected to the circuit and mounted to the circuit board. The control connectors are configured to connect the control circuit to ventilation fans or other components to be controlled. The control connectors are connected to a fault detection device of the control circuit operable to generate a fault signal upon occurrence of a predetermined fault condition at the control connectors. The control circuit is configured to disable the fault detection device with respect to the fault condition from any control connector that is not connected to a ventilation fan or other component to be controlled, depending on a predetermined input state determinable by a signaling device that is connectable with a ventilation fan to one of the control connectors.

20 Claims, 4 Drawing Sheets

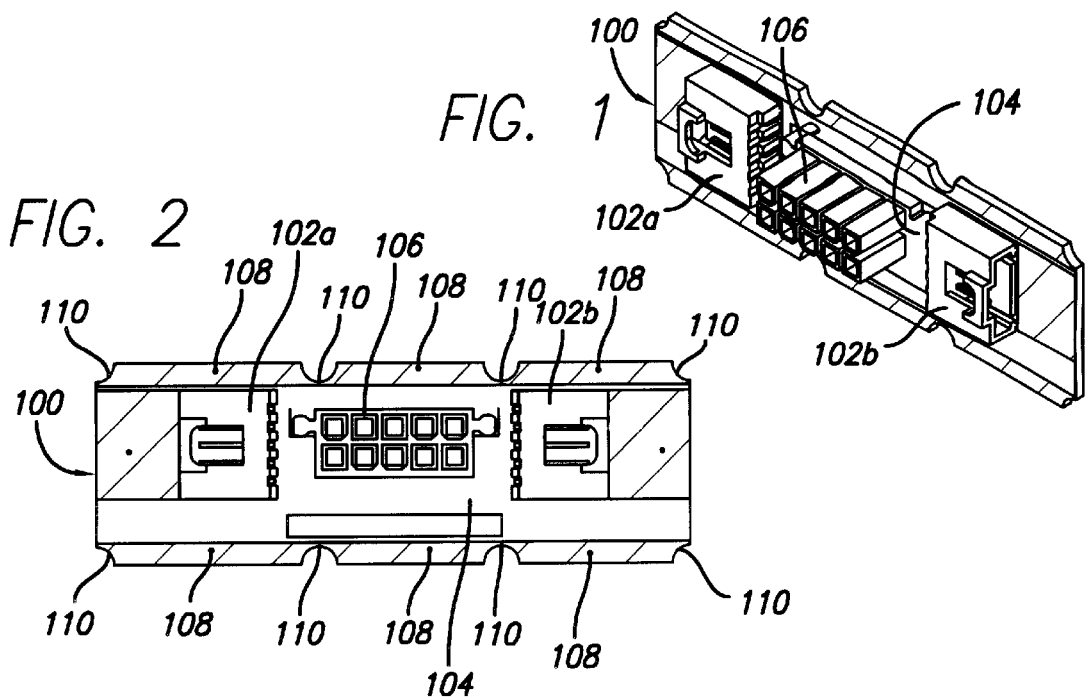
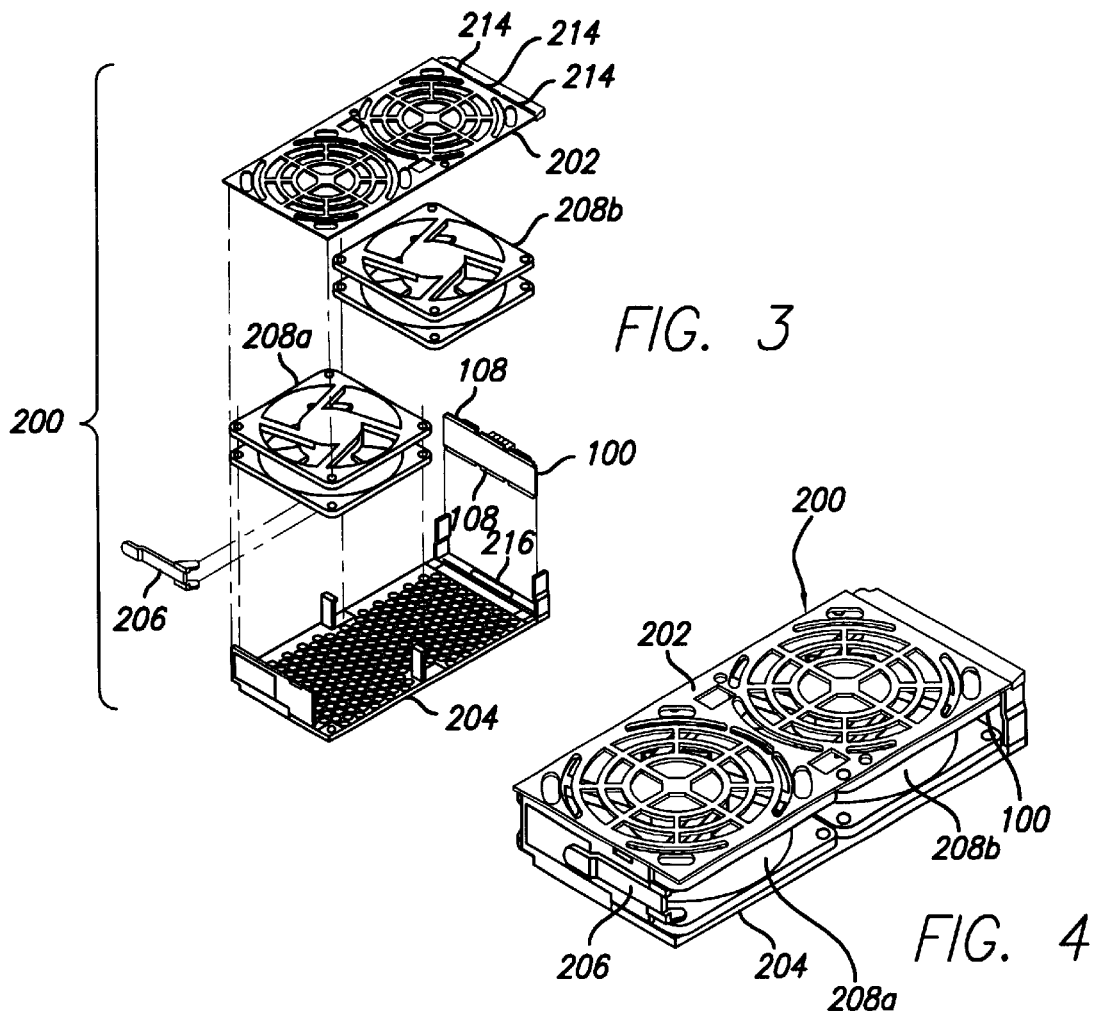

INTERCHANGEABLE FAN CONTROL BOARD WITH FAULT DETECTION

BACKGROUND OF THE INVENTION

1. Field of the Invention

The present invention relates to control circuits for electronic components, and more particularly, to integrated circuit devices for controlling the operation of motorized ventilation fans for electronics enclosures, and the like.

2. Description of Related Art

Modular ventilation fan assemblies, sometimes called fan tray assemblies (or more briefly, "Tan trays") are used for mounting ventilation fans to electronics enclosures, such as computer enclosures. The modular fan trays comprise an electromagnetic interference (EMI) shield, one or more ventilation fans for thermal control of the electronics enclosure, and a control circuit for the ventilation fan or fans. For more efficient manufacturing and assembly, fan trays may be constructed using a common interface design and common components across different designs.

It is often desirable for the fan control circuit to provide a fault signal when predetermined fault conditions are met. Such fault conditions may include a ventilation fan that is missing, electrically disconnected, or otherwise inoperable. Generation of the fault signal permits the fan tray to be replaced before the fault condition causes overheating to occur in the electronics enclosure. In addition, it may sometimes be desirable for a common fan control board to be used with fan trays that incorporate different numbers of fans, for example, a single fan or a pair of fans.

Prior art fan control boards, however, cannot be used for fault detection with different numbers of fans without reconfiguring the boards depending on the number of fans in the fan tray. For example, a prior art board configured for a dual-fan fan tray will generate a fault signal if used in a single-fan fan tray, because the single fan will be interpreted as a fault condition. Conversely, a prior art board configured for fault detection of a single fan only is incapable of reliably signaling the failure of a dual-fan system. Prior art approaches for reconfiguring circuit boards, for example, jumpers, component stuffing options, and switches, do not allow for an identically configured fan control board to be used with fan trays having different numbers of fans. Accordingly, prior art control boards may cause undesirable inefficiencies in manufacturing and assembly.

SUMMARY OF THE INVENTION

The present invention provides an interchangeable fan control board, including a fault detection circuit for use with multiple connected components such as ventilation fans, that overcomes the limitations of prior art fan control boards. The fan control board may be used in an identical configuration for different fan tray assemblies containing different numbers of ventilation fans. As such, use of the interchangeable fan control board of the present invention may substantially reduce manufacturing and assembly costs associated with fan trays, while providing fully functional fan control and fault detection.

In an embodiment of the invention, the fan control board is provided with a common electrical connector for connecting the fan tray to other electronics, such as within the electronic enclosure, and a plurality of ventilation fan connectors equal to the maximum number of ventilation fans that the board will control. The ventilation fans for use with the fan control board are provided with a loop back jumper or other passive signaling device according to a logical scheme that disables fault signaling for unused fan connectors on the board.

For example, for a fan control board to be used for both single-fan and dual-fan fan trays, the ventilation fan for the single-fan configuration may be provided with a loop back jumper or other passive signaling device integrated into its fan connection cable. The fan control board, in turn, may be configured to detect when a fan with the passive signaling device is attached to one of the fan connectors, and to disable fault detection for the unused fan connector when such a condition occurs. Conversely, when a single fan for the dual-fan assembly lacking a passive signaling device is attached to the fan control board, the fan control board will signal a fault condition if an operable ventilation fan is not also connected to its second fan connector. Thus, the fan control board may be used interchangeable in an identical configuration with both single-fan and dual-fan fan trays.

The fan control board is anticipated to be particularly effective when the fans for the different fan configurations (e.g., single-fan or dual-fan configurations) are inherently different for reasons unrelated to the presence or absence of a passive signaling device. For example, fans for a single-fan configuration may inherently be a different size, shape, and/or capacity from fans for a dual-fan configuration. If so, the passive signaling devices required for operation of the preferred embodiment of the invention may be provided on ventilation fans without re-introducing any portion of the inefficiencies that are saved by use of the interchangeable fan control board. In the alternative, but less preferably, otherwise identical ventilation fans may be distinguished solely by the presence or absence of a passive signaling device in their cabling and/or connector.

A more complete understanding of the interchangeable fan control board will be afforded to those skilled in the art, as well as a realization of additional advantages and objects thereof, by a consideration of the following detailed description of the preferred embodiment. Reference will be made to the appended sheets of drawings which will first be described briefly.

BRIEF DESCRIPTION OF THE DRAWINGS

FIG. 1 is a perspective view of an exemplary control board according to the invention.

FIG. 2 is a plan view of the exemplary control board shown in FIG. 1.

FIG. 3 is an exploded perspective view of an exemplary dual-fan fan tray for assembly with the control board shown in FIGS. 1–2.

FIG. 4 is a perspective view of the dual-fan fan tray shown in FIG. 3, as assembled to the control board.

DETAILED DESCRIPTION OF THE PREFERRED EMBODIMENT

The interchangeable fan control board of the present invention, which includes a fault detection circuit for use with multiple connected ventilation fans, may be used in an identical configuration for different fan tray assemblies containing different numbers of ventilation fans. In the detailed description that follows, like element numerals are used to indicate like elements appearing in one or more of the figures.

An exemplary control board 100 according to the invention is shown in FIGS. 1 and 2. The control board may be provided in different shapes and sizes depending on the requirements of the invention. The control board 100 is provided with control connectors 102a, 102b for connecting to the components to be controlled. In the exemplary embodiment, the components to be controlled are ventilation fans, and the maximum number of controlled components is two. In other embodiments of the invention, the controlled components may be something other than ventilation fans, and/or the maximum number of controlled components may be greater than two. The control connectors may be configured to detachably connect to cable connectors of ventilation fans, as shown.

Figure 6:
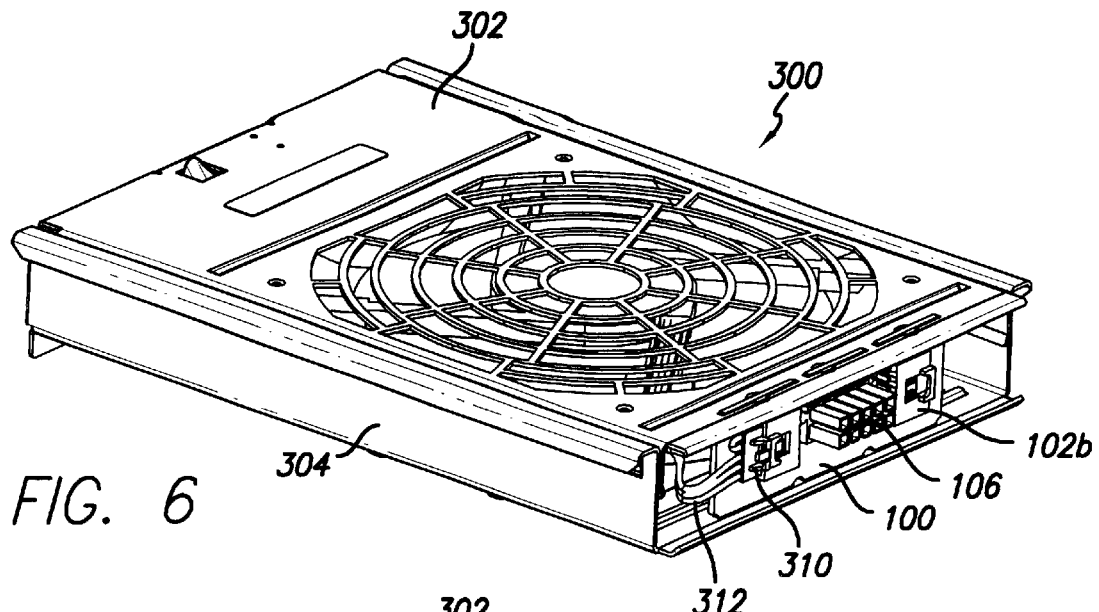
FIG. 6 is a perspective view of the single-fan fan tray shown in FIG. 5, as assembled to the control board.
Figure 5:
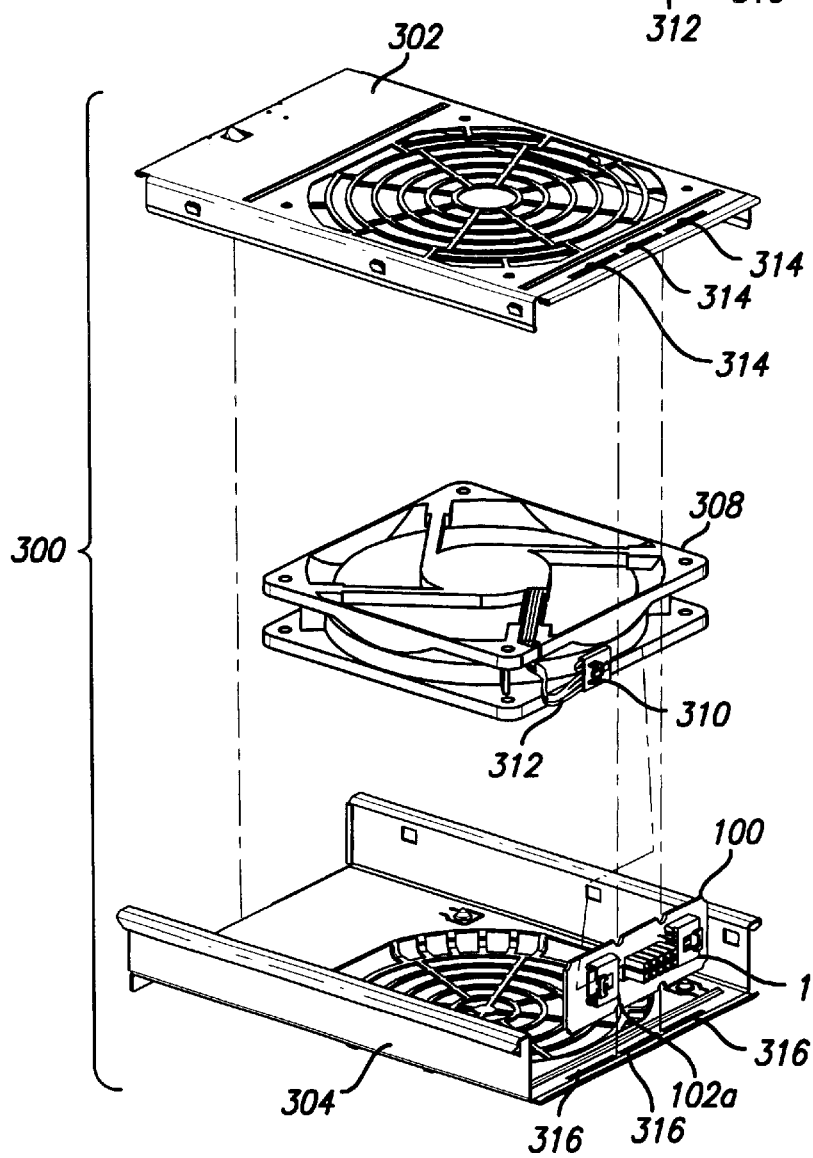
FIG. 5 is an exploded perspective view of an exemplary single-fan fan tray for assembly with the control board shown in FIGS. 1–4.

The control connectors 102a, 102b are connected to a control circuit 104, which may be printed on board 100 using any suitable method. The control circuit 104 may also be connected to an interface connector 106 mounted to board 100, for connecting the control board to an external power source, ground, indicator circuits, and/or other control circuits, as desired. The interface connector 100 may extend away from the control board, and the control connectors 102a, 102b may be oriented at right angles to the interface connector, i.e., parallel to board 100. As shown, the circuit board is configured for assembly at an end of a fan tray, with the interface connector extending away from the fan tray, as shown in FIGS. 4–6 below.

It may be advantageous for board 100 to be configured for assembling to a fan tray without the use of a separate fastener, such as a screw, rivet, clip, or the like. In an embodiment of the invention, board 100 is generally rectangular with a plurality of tabs 108 extending from its periphery for inserting into corresponding slots of a fan tray. Tabs 108 may be separated by cutouts such as semi-circular cutouts 110. Examples of corresponding slots are shown in FIG. 3 at 214 and 216, and in FIG. 5 at 314 and 316. In the alternative, the circuit board 100 may be configured for assembling to a fan tray using conventional fasteners, such as by providing a plurality of circular through holes (not shown) in the board, or by any other suitable method.

Board 100 may be used in fan trays with different numbers of ventilation fans, while still providing reliable fault detection for each type of fan tray. By way of example only, and not by way of limitation, an exemplary dual-fan fan tray 200 for assembly with control board 100 is shown in FIGS. 3–4. An exemplary single-fan fan tray 300 for assembly with control board 100 is shown in FIGS. 5–6.

Fan tray 200 comprises outlet grill plate 202, inlet grill plate 204, a handle 206, and, interposed between plates 202 and 204, ventilation fans 208a, 208b and circuit board 100. Ventilation fans 208a, 208b are connected by cables (not shown) to control connectors 102a, 102b, respectively, of circuit board 100. Circuit board 100 is mounted to fan tray 200 by insertion of tabs 108 into slots 214 and 216.

Fan tray 300 comprises top shell 302, bottom shell 304, and, interposed between shells 203, 304, a ventilation fan 308 and circuit board 100. Ventilation fan 308 is connected to control connector 102a by cable 312 and connector 310. Control connector 102b is unconnected. Circuit board 100 is mounted to fan tray 300 by insertion of tabs 108 into slots 314 and 316.

In the foregoing examples, ventilation fans 208a, 208b are a different type from (i.e., smaller than) ventilation fan 308. Accordingly, it is especially convenient for manufacturing purposes to configure the fans differently with respect to their electrical connection to board 100. In particular, in an embodiment of the invention, a signaling device (not shown) is incorporated into cable 312, connector 310 and/or other part of fan 308. Circuit 104 of board 100 is then configured so that the signaling device operates to disable fault detection (i.e., prevent generation of a fault signal) that would otherwise result from the unconnected control connector 102b in fan tray assembly 300. In the alternative, a signaling device may be incorporated into both ventilation fans 208a, 208b of assembly 200, in which case circuit 104 is configured such that the absence of a signaling device is operative to disable generation of a fault signal that would otherwise result from the unconnected control connector 102b of fan tray 300. In more general terms, circuit 100 is configured to disable fault detection depending on a predetermined signal state that is determinable by a signaling device to be connected to one of connectors 122a, 102b integrally with an electronic component to be controlled.

The signaling device is preferably a passive device, i.e., a device that indicates a state without performing any action of its own. For example, a passive signaling device may be a loop back jumper in a cable of a ventilation fan, such as cable 312. The loop jump backer is a wire that short-circuits two pins of connector 310, as known in the art. In the alternative, a passive signaling device may be a physical feature of connector 310, such as a tab or hole, configured to interact with a mechanical or optical switch on board 100. One of ordinary skill may devise other suitable passive signaling devices.

Figure 7:
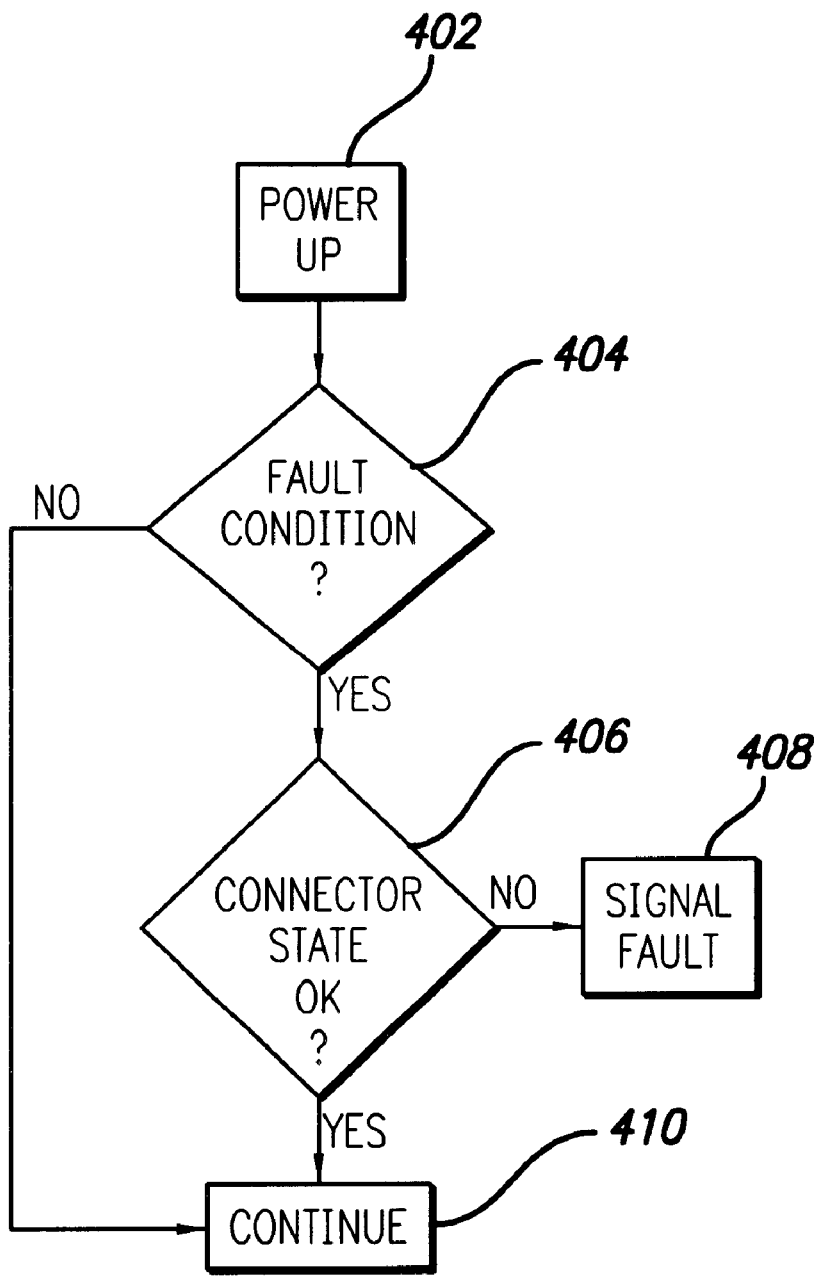
FIG. 7 is a flow diagram illustrating operation of a circuit configured according to the invention.

Configuration of circuit 104 of board 100 is illustrated by the flow diagram in FIG. 7. Circuit 104 is configured to be responsive to a fault condition at one or more input pins. Circuit 104 is further configured to be responsive to a state at another input pin or at other input pins associated with the control connectors of the circuit, for disabling fault signaling. After being powered up at 402, circuit 104 signals a fault 408 at an output pin, if a fault condition exists at 404 and the state of the control connectors is "OK" at 406, i.e., matches predetermined criteria. On the other hand, if either of 404 or 406 are false, circuit 104 maintains its normal operating state without signaling a fault. One of ordinary skill may devise different circuits to perform the described function.

Figure 8:
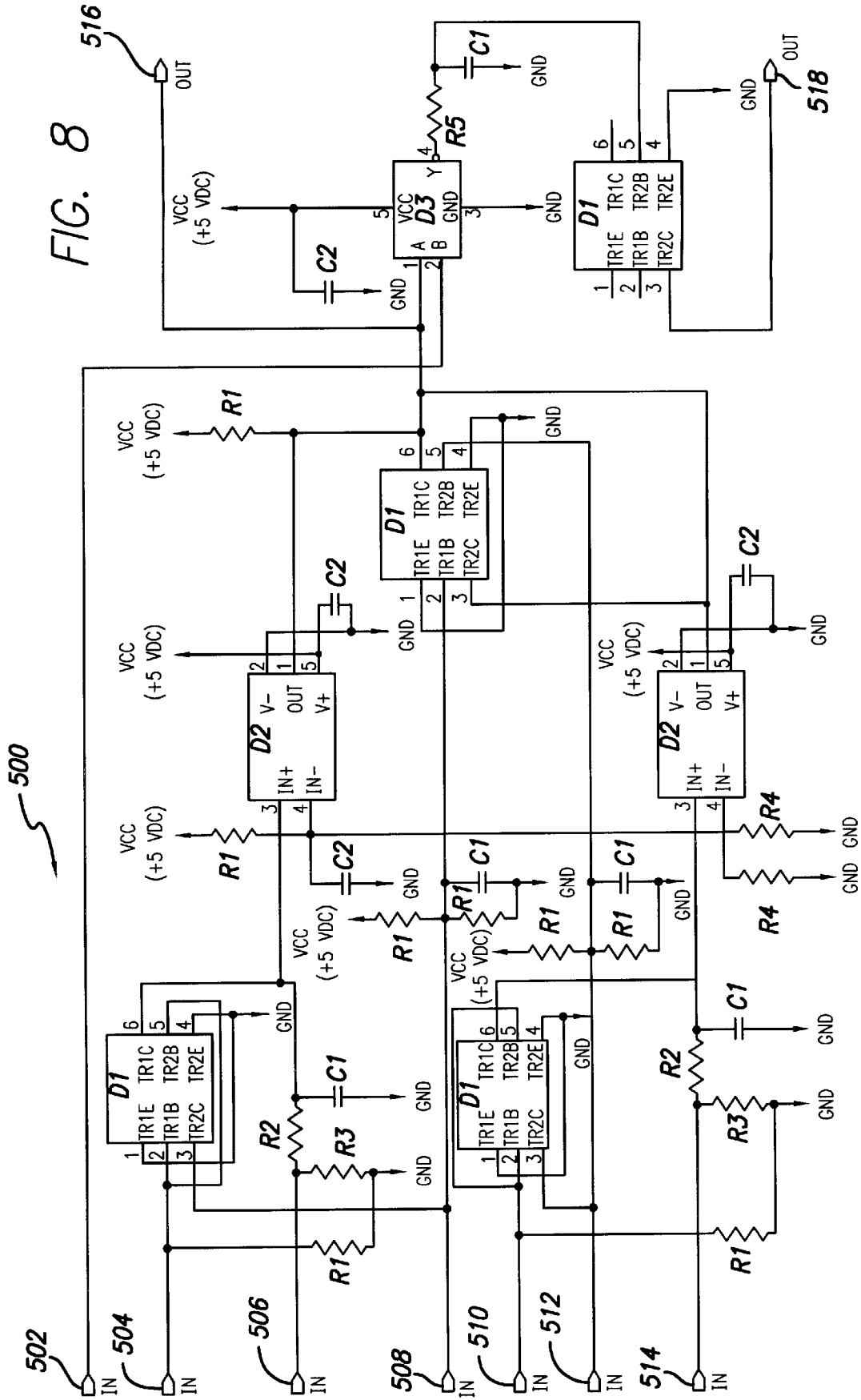
FIG. 8 is a circuit diagram of an exemplary circuit according to the invention.

An exemplary circuit 500 suitable for performing a fault detection function according to the invention is shown in FIG. 8. In particular, the fault detection function comprises generating a fault signal when one of a plurality of controlled components is not connected to the circuit 500, while also preventing generation of such fault signal depending on a predetermined input state that is determinable by a signaling device to be connected integrally with a controlled component to the circuit 500. It should be appreciated that circuit 104 of board 100 may contain circuit 500 in addition to other circuits for performing other functions. For example, circuit 104 may also contain a circuit for speed control of ventilation fans.

Selected elements of circuit 500 as shown in FIG. 8 are described in Table 1 below:

TABLE 1

| Reference Characters | Description |
| --- | --- |
| R1 | Resistor, 22.5 kΩ, 0.10 W, 1% |
| R2 | Resistor, 1.0 kΩ, 0.10 W, 1% |
| R3 | Resistor, 0.2 Ω, 0.25 W, 1% |
| R4 | Resistor, 220 Ω, 0.063 W, 5% |
| R5 | Resistor, 100 Ω, 0.10 W, 1% |
| C1 | Capacitor, 10 µF, 16 V, 20% |
| C2 | Capacitor, 0.1 µF, 25 V, 10% |
| D1 | Dual Bipolar Transistor, PUMH4 SOT |
| D2 | Voltage Comparator, MIC6270 SC23 |
| D3 | 1-bit Switch, AHCT1G02 SC59 |
| VCC | +5 V |
| GND | GROUND |

Input pin 502 carries a logic signal that enables or disables the fault reporting of the fan tray assembly. Input pins 504, 506, and 508 are connected to separate pins of a control connector such as connector 102a of board 100. Pin 508 carries a logic level signal that indicates a motor fault. Pin 506 is a ground pin (power return of fan motor) and pin 504 is for operation of the passive signaling device described hereinabove. Pins 510, 512, and 514 similarly relate to separate pins of another control connector, such as connector 102b of board 100.

In normal operation (i.e., when there is no signaling device connected to connectors 102a, 102b), circuit 500 generates a fault signal at output pin 518 when the state at either set of input pins 504, 506, 508 or 510, 512, 514 indicates that either group of pins is not connected to a ventilation fan. The fault signal at pin 518 may be connected to a socket of interface connector 106 on board 100. Conversely, connecting pin 504 to pin 506, or pin 510 to pin 514, prevents circuit 500 from generating a fault signal at pin 518 from an open control connector. The signal at pin 518 then indicates normal operation unless a fault, such as a motor speed (tachometer) fault occurs in the ventilation fan that is connected to circuit 500. Pin 504 may be connected to pin 506, or pin 510 to pin 514, using any suitable passive signaling device such as a loop back jumper in cable 312 of fan 308.

Similarly, circuit 500 generates a fault signal at output pin 516 when the state at either set of input pins 504, 506, 508 or 510, 512, 514 indicates that either group of pins is not connected to a ventilation fan. The fault signal at pin 516 is fed back into a status register of circuit 100, that is reported to the system. Connecting pin 504 to pin 506, or pin 510 to pin 514, (such as by using a loop back jumper in a fan connector) also prevents circuit 500 from generating a fault signal at pin 516 from an open control connector. This circuit configuration allows normal operation of motor speed fault detection when only a single fan is connected to circuit 500.

Other details concerning the operation or elements of circuit 500 should be apparent by examination of FIG. 8 in view of the above table and description. It should also be apparent that many different circuits may be devised to perform essentially the same functions as circuit 500, with respect to fault signaling of ventilation fans or like components, and disabling of fault signaling in cooperation with a component-mounted signaling device.

Having thus described a preferred embodiment of the interchangeable fan control board, it should be apparent to those skilled in the art that certain advantages of the within system have been achieved. It should also be appreciated that various modifications, adaptations, and alternative embodiments thereof may be made within the scope and spirit of the present invention. For example, a control board for ventilation fans using a loop back jumper as a passive signaling device has been illustrated, but it should be apparent that the inventive concepts described above would be equally applicable for controlling components other than ventilation fans, and using signaling devices other than loop back jumpers. The invention is further defined by the following claims.

What is claimed is:

1. A control board for controlling operation of a plurality of ventilation fans and generating a fault signal upon occurrence of a predetermined fault condition, the control board comprising:

a control circuit in a circuit board;

an interface connector connected to the control circuit and mounted to the circuit board, and configured to connect the control circuit to an external power source; and a plurality of control connectors connected to the circuit and mounted to the circuit board, and configured to connect the control circuit to the plurality of ventilation fans, the plurality of control connectors connected to a fault detection device of the control circuit operable to generate a fault signal upon occurrence of a predetermined fault condition at the plurality of control connectors, wherein the control circuit is configured to disable the fault detection device with respect to the fault condition from an unconnected one of the plurality of control connectors depending on a predetermined input state determinable by a signaling device that is connectable with a ventilation fan to one of the plurality of control connectors.

2. The control board of claim 1, wherein the signaling device is a passive signaling device.

3. The control board of claim 1, wherein the signaling device is a loop back jumper in a cable of a ventilation fan.

4. The control board of claim 1, wherein the control circuit is configured to provide the fault signal at a socket of the interface connector.

5. The control board of claim 1, wherein the circuit board is configured for assembly to a fan tray.

6. The control board of claim 5, wherein the circuit board is configured for assembly to the fan tray without using any separate fastener.

7. The control board of claim 5, wherein the circuit board is generally rectangular with a plurality of tabs extending from its periphery for inserting into corresponding slots of a fan tray.

8. The control board of claim 5, wherein the circuit board is configured for assembly at an end of the fan tray with the interface connector extending away from the fan tray.

9. The control board of claim 1, wherein the control connectors are configured to detachably connect to cable connectors of ventilation fans.

10. The control board of claim 1, wherein the control connectors are oriented at right angles to the interface connector.

11. A control circuit for controlling operation of a plurality of electronic components and generating a fault signal upon occurrence of a predetermined fault condition, the control circuit comprising:

connecting means for connecting the control circuit to a plurality of electronic components;

generating means for generating a fault signal when any connector of the connecting means is not connected to any of the plurality of electronic components; and preventing means for preventing the generating means from generating the fault signal, depending on a predetermined input state determinable by a signaling device integral with at least one of the plurality of electronic components.

12. The control circuit of claim 11, further comprising a second connecting means for connecting the control circuit to an external power source.

13. The control circuit of claim 11, wherein the signaling device is a passive signaling device.

14. The control circuit of claim 11, wherein the signaling device is a loop back jumper in a connection cable of the at least one of the plurality of electronic components.

15. The control circuit of claim 11, wherein the plurality of electronic components are a plurality of ventilation fans.

16. The control circuit of claim 15, further comprising means for assembling the control circuit to a fan tray.

17. The control circuit of claim 15, further comprising means for assembling the control circuit to a fan tray without using any separate fastener.

18. The control circuit of claim 15, further comprising a circuit board containing the control circuit, wherein the circuit board is generally rectangular with a plurality of tabs extending from its periphery for inserting into corresponding slots of a fan tray.

19. The control circuit of claim 15, further comprising a circuit board containing the control circuit and an interface connector, wherein the circuit board is configured for assembly at an end of a fan tray with the interface connector extending away from the fan tray.

20. The control circuit of claim 19, wherein the connecting means comprises sockets for detachably connecting to cable connectors of ventilation fans.

* * * * *